(12) United States Patent
Pourghorban Saghati et al.

(10) Patent No.: US 12,021,290 B2
(45) Date of Patent: Jun. 25, 2024

(54) RADIO-FREQUENCY TRANSMISSION LINE STRUCTURES FOR WIRELESS CIRCUITRY BASED ON CONDUCTIVE TRACES ON MULTIPLE PRINTED CIRCUITS

(71) Applicant: Apple Inc., Cupertino, CA (US)

(72) Inventors: Alireza Pourghorban Saghati, San Jose, CA (US); Mohammed W. Mokhtar, San Jose, CA (US); Ali N. Ergun, Sunnyvale, CA (US); Oren S. Levy, San Rafael, CA (US); Arman Samimi-Dehkordi, San Jose, CA (US); Sean T. McIntosh, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 71 days.

(21) Appl. No.: 17/380,491

(22) Filed: Jul. 20, 2021

(65) Prior Publication Data
US 2023/0028370 A1 Jan. 26, 2023

(51) Int. Cl.
*H01P 5/02* (2006.01)
*H01P 3/08* (2006.01)
(Continued)

(52) U.S. Cl.
CPC ............... *H01P 5/028* (2013.01); *H01P 3/08* (2013.01); *H04R 1/1091* (2013.01);
(Continued)

(58) Field of Classification Search
CPC .................................. H01P 5/028; H01P 5/02
(Continued)

(56) References Cited

U.S. PATENT DOCUMENTS

| 5,773,887 A | * | 6/1998 | Pavio et al. | ............ | H01L 23/66 |
| | | | | | 257/664 |
| 5,808,529 A | * | 9/1998 | Hamre | ................. | H05K 1/0219 |
| | | | | | 333/260 |

(Continued)

FOREIGN PATENT DOCUMENTS

WO 2020258743 A1 12/2020

OTHER PUBLICATIONS

U.S. Appl. No. 17/318,927, filed May 12, 2021.

*Primary Examiner* — Benny T Lee
(74) *Attorney, Agent, or Firm* — Treyz Law Group, P.C.; Tianyi He (57) ABSTRACT

An electronic device may include one or more radios and one or more antennas. Radio-frequency transmission lines may couple a radio to a corresponding antenna. To more efficiently form a radio-frequency transmission line, the radio-frequency transmission line may be formed from interconnected conductive traces distributed between a plurality of printed circuits. By integrating transmission line structures onto printed circuits that also serve other functions, the device can require less space to implement a radio-frequency transmission line. While one or more of these printed circuits may individually be unsuitable to implement a radio-frequency transmission line with a particular impedance, the composite impedance of these transmission line structures across the printed circuits, when properly configured, may provide a radio-frequency transmission line with the particular impedance.

18 Claims, 7 Drawing Sheets

(51) Int. Cl.
*H04R 1/10* (2006.01)
*H05K 1/02* (2006.01)

(52) U.S. Cl.
CPC ....... *H05K 1/0243* (2013.01); *H04R 2420/07* (2013.01); *H05K 2201/10083* (2013.01); *H05K 2201/10098* (2013.01)

(58) Field of Classification Search
USPC .......................................... 333/246, 24 R, 33
See application file for complete search history.

(56) References Cited

U.S. PATENT DOCUMENTS

| | | |
|---|---|---|
| 6,317,011 B1 | 11/2001 | Barnett et al. |
| 2014/0085856 A1* | 3/2014 | Shirao et al. ........... H01P 3/003 174/254 |
| 2015/0230330 A1* | 8/2015 | Lee et al. ............... H05K 1/025 29/830 |
| 2017/0201821 A1 | 7/2017 | McAuliffe et al. |
| 2019/0082536 A1 | 3/2019 | Park et al. |
| 2019/0312347 A1 | 10/2019 | Edwards et al. |
| 2020/0021019 A1 | 1/2020 | Rajagopalan et al. |
| 2020/0194859 A1* | 6/2020 | Araki .................... H05K 1/111 |

\* cited by examiner

RADIO-FREQUENCY TRANSMISSION LINE STRUCTURES FOR WIRELESS CIRCUITRY BASED ON CONDUCTIVE TRACES ON MULTIPLE PRINTED CIRCUITS

FIELD

This disclosure relates generally to electronic devices, including electronic devices with wireless circuitry.

BACKGROUND

Electronic devices are often provided with wireless capabilities. An electronic device with wireless capabilities has wireless circuitry that includes one or more antennas and one or more radios, with corresponding radio-frequency transmission lines that convey radio-frequency signals between the antennas and the radios.

A radio-frequency transmission line can often be implemented using a co-axial cable. However, the co-axial cable and corresponding connector structures associated therewith are bulky and consume excessive space within the electronic device. It can therefore be challenging to design compact electronic devices while still providing transmission lines with satisfactory performance.

SUMMARY OF THE INVENTION

An electronic device may include wireless circuitry having one or more radios and one or more antennas. A radio-frequency transmission line may couple each antenna to a corresponding radio. The radio-frequency transmission line may be integrated into printed circuit structures across one or more overlapping printed circuits. If desired, these printed circuits can include flexible printed circuits, rigid printed circuit boards, interposers, package substrates, etc.

Conductive structures in these printed circuits interconnected by solder or other conductive interconnect structures between the printed circuits may form portions of the radio-frequency transmission line. Each portion of the radio-frequency transmission line individually may exhibit an (individual) impedance that is offset from a target (composite or collective characteristic) impedance of the overall radio-frequency transmission line. By controlling the configuration (e.g., thicknesses of conductive and insulator layers) of each of the printed circuits, the configuration (e.g., distances) between the printed circuits (e.g., between conductive structures in the printed circuits), and the configuration of the printed circuits relative to other neighboring structures (e.g., structures or components adjacent to one or more of these printed circuits), the portions of the radio-frequency transmission line may collectively exhibit the target impedance for the overall radio-frequency transmission line that is properly impedance-matched for coupling the radio to the antenna and for operation at one or more corresponding frequencies of operation.

The radio-frequency transmission line configured in this manner can convey radio-frequency signals to and from the antenna without mismatch loss. Accordingly, discrete components such as inductors and capacitors useable for impedance matching (e.g., impedance matching structures external to the printed circuit structures forming the radio-frequency transmission line) can therefore be omitted as the radio-frequency transmission line itself serves inherently as an impedance matching structure. In other words, the impedance offsets of the different portion of the radio-frequency transmission line (from the target impedance) are not matched using the discrete components. Rather, the different portions of the radio-frequency transmission line on the different printed circuits are configured or tuned relative to each other (e.g., by adjust layer thickness, distance between layers, layer geometry, layer material, etc.) to directly achieve signal conveyance without mismatch loss.

In this manner, the electronic device can use printed circuits structures (e.g., on printed circuits that also serve other functions in the electronic device) to integrate radio-frequency transmission line structures. Accordingly, the need for bulky radio-frequency transmission line structures (e.g., co-axial cables and their connectors) are omitted and a compact radio-frequency transmission line having satisfactory performance is provided. As an illustrative example and as further detailed herein, the satisfactory performance of the radio-frequency transmission line is characterized at least by an impedance associated with the radio-frequency transmission line that is matched with the impedance of the coupled antenna.

An aspect of the disclosure provides radio-frequency transmission line structures. The radio-frequency transmission line structures can exhibit a composite impedance and can include a first printed circuit and a second printed circuit. The first printed circuit can have a first substrate and first conductive traces on the first substrate. The first conductive traces can exhibit a first impedance. The second printed circuit can have a second substrate and second conductive traces on the second substrate. The second conductive traces can exhibit a second impedance. The second printed circuit can at least partially overlap the first printed circuit and can be separated from the first printed circuit by a distance. The first impedance, the second impedance, and the distance separating the second printed circuit from the first printed circuit can collectively define the composite impedance of the radio-frequency transmission line structures.

An aspect of the disclosure provides a radio-frequency transmission line. The radio-frequency transmission line can include a signal conductor and a ground conductor. The signal conductor can include first signal traces on a first printed circuit and second signal traces on a second printed circuit. The ground conductor can include first ground traces on the first printed circuit and second ground traces on the second printed circuit. The first signal traces and the first ground traces on the first printed circuit can exhibit a first impedance. The second signal traces and the second ground traces on the second printed circuit can exhibit a second impedance. The radio-frequency transmission line can exhibit a characteristic impedance that is different from the first impedance and that is different from the second impedance.

An aspect of the disclosure provides an electronic device. The electronic device can include a radio, an antenna, a first printed circuit substrate, a second printed circuit substrate that at least partially overlaps the first printed circuit substrate, and a radio-frequency transmission line that communicably couples the radio to the antenna. The radio-frequency transmission line can have a first transmission line portion on the first printed circuit substrate and a second transmission line portion on the second printed circuit substrate. The first transmission line portion can exhibit a first impedance. The second transmission line portion can exhibit a second impedance. The radio-frequency transmission line can exhibit a collective impedance that is different than the first impedance and different than the second impedance.

DETAILED DESCRIPTION OF THE INVENTION

Figure 1:
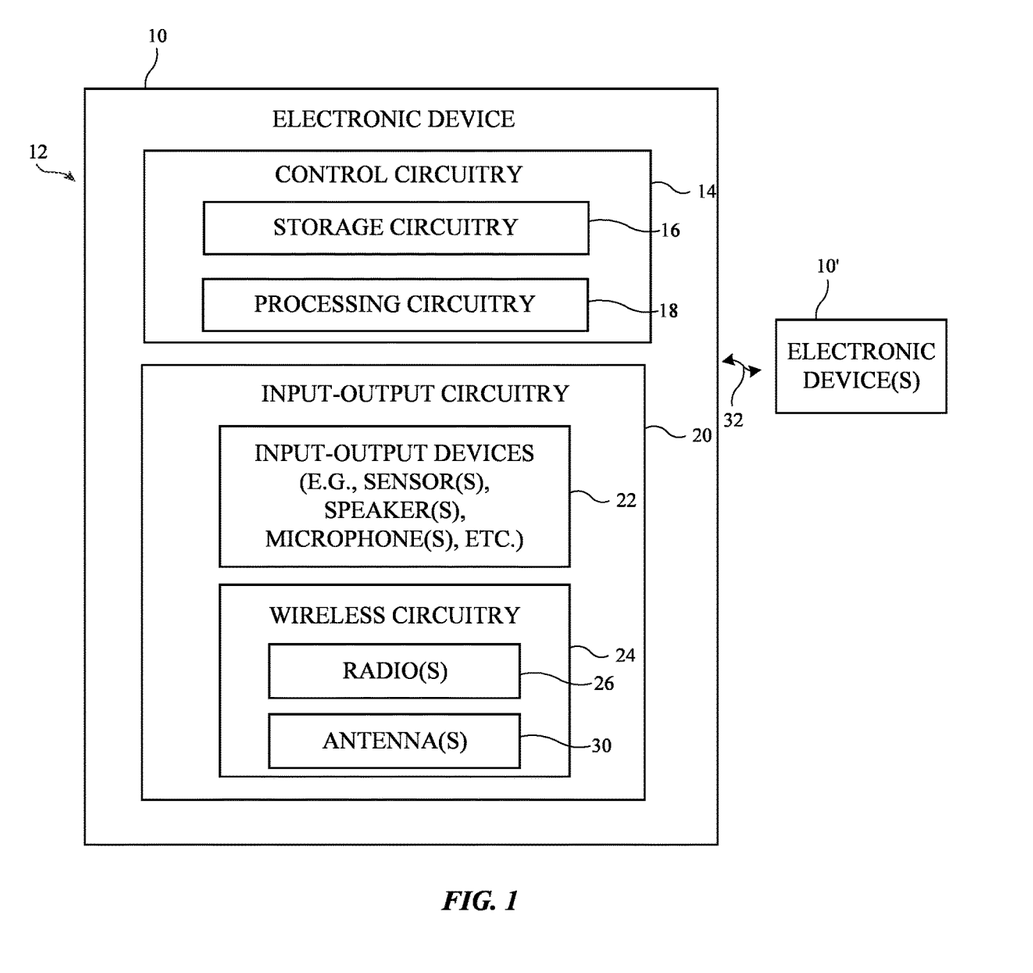
FIG. 1 is a block diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device such as an earbud, a set of earbuds, or a set of earbuds with a corresponding case that houses the earbuds, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a "case," may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors, microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as "program instructions," "software," "data," "instructions," or "code." Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as "Wi-Fi®"), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), temperature sensors, etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications and/or radio-based spatial ranging operations. Wireless circuitry 24 may include one or more antennas 30. Wireless circuitry 24 may also include one or more radios 26. Each radio 26 may include circuitry that operates on signals at baseband frequencies (e.g., baseband processor circuitry), signal generator circuitry, modulation/demodulation circuitry (e.g., one or more modems), radio-frequency transceiver circuitry (e.g., radio-frequency transmitter circuitry, radio-frequency receiver circuitry, mixer circuitry for downconverting radio-frequency signals to baseband frequencies or intermediate frequencies between radio and baseband frequencies and/or for upconverting signals at baseband or intermediate frequencies to radio-frequencies, etc.), amplifier circuitry (e.g., one or more power amplifiers and/or one or more low-noise amplifiers (LNAs)), analog-to-digital converter (ADC) circuitry, digital-to-analog converter (DAC) circuitry, control paths, power supply paths, signal paths (e.g., radio-frequency transmission lines, intermediate frequency transmission lines, baseband signal lines, etc.), switching circuitry, filter circuitry, and/or any other circuitry for transmitting and/or receiving radio-frequency signals using antenna(s) 30. The components of each radio 26 may be mounted onto a respective substrate or integrated into a respective integrated circuit, chip, package (e.g., system-in-package), or system-on-chip (SOC). If desired, the components of multiple radios 26 may share a single substrate, integrated circuit, chip, package, or SOC.

Antenna(s) 30 may be formed using any desired antenna structures. For example, antenna(s) 30 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antenna(s) 30 over time.

Transceiver circuitry in radios 26 may convey radio-frequency signals using one or more antennas 30 (e.g., antenna(s) 30 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antenna(s) 30 may transmit the radio-frequency signals by radiating the radio-frequency signals into free space (or to free space through intervening device structures such as a dielectric cover layer). Antenna(s) 30 may additionally or alternatively receive the radio-frequency signals from free space (e.g., through intervening devices structures such as a dielectric cover layer). The transmission and reception of radio-frequency signals by antenna(s) 30 each involve the excitation or resonance of antenna currents on an antenna resonating element in the antenna by the radio-frequency signals within the frequency band(s) of operation of the antenna.

Radios 26 may use antenna(s) 30 to transmit and/or receive radio-frequency signals within different frequency bands at radio frequencies (sometimes referred to herein as "communications bands" or simply as "bands"). The frequency bands handled by radios 26 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications (NFC) frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802 family of standards, and/or any other desired frequency bands of interest.

Each radio 26 may transmit and/or receive radio-frequency signals according to a respective radio access technology (RAT) that determines the physical connection methodology for the components in the corresponding radio. One or more radios 26 may implement multiple RATs if desired. As just one example, the radios 26 in device 10 may include a UWB radio for conveying UWB signals using one or more antennas 30, a Bluetooth (BT) radio for conveying BT signals using one or more antennas 30, a Wi-Fi radio for conveying WLAN signals using one or more antennas 30, a cellular radio for conveying cellular telephone signals using one or more antennas 30 (e.g., in 4G frequency bands, 5G FR1 bands, and/or 5G FR2 bands), an NFC radio for conveying NFC signals using one or more antennas 30, and a wireless charging radio for receiving wireless charging signals using one or more antennas 30 for charging a battery on device 10. This example is merely illustrative and, in general, radios 26 may include any desired combination of radios for covering any desired combination of RATs.

Radios 26 may use antenna(s) 30 to transmit and/or receive radio-frequency signals to convey wireless communications data between device 10 and external wireless communications equipment such as one or more electronic devices 10' (e.g., one or more other devices such as device 10, a wireless access point or base station, etc.) via communications link(s) 32. Wireless communications data may be conveyed by radios 26 bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc. Radios 26 may also use antenna(s) 30 to perform spatial ranging operations (e.g., for identifying a distance between device 10 and an external object). Radios 26 that perform spatial ranging operations may include radar circuitry if desired (e.g., frequency modulated continuous wave (FMCW) radar circuitry, orthogonal frequency division multiplexing (OFDM) radar circuitry, frequency stepped continuous wave (FSCW) radar circuitry, a phase coded radar circuitry, other types of radar circuitry).

Configurations in which device 10 is a headset, headphone, earphone, or earbud are sometimes described herein as illustrative examples. In these configurations, one or more devices 10', with which device 10 performs wireless communications, may include a primary device (e.g., a laptop computer, a desktop computer, a tablet computer, a cellular telephone, etc.) for which device 10 is an accessory. In an illustrative configuration in which device 10 is an earbud for one of a user's ears, device 10 may perform wireless communications with device 10' which may be an earbud for the other one of the user's ears. These configurations for devices 10 and 10' are merely illustrative. If desired, devices 10 and 10' may include any number of electronic devices that communicate with one another wirelessly.

The example of FIG. 1 is merely illustrative. While control circuitry 14 is shown separately from wireless circuitry 24 in the example of FIG. 1 for the sake of clarity, wireless circuitry 24 may include processing circuitry (e.g., one or more processors) that forms a part of processing circuitry 18 and/or storage circuitry that forms a part of storage circuitry 16 of control circuitry 14 (e.g., portions of control circuitry 14 may be implemented on wireless circuitry 24). Wireless circuitry 24 may include any desired number of antennas 30. Some or all of the antennas 30 in wireless circuitry 24 may be arranged into one or more phased antenna arrays (e.g., for conveying radio-frequency signals over a steerable signal beam). If desired, antenna(s) 30 may be operated using a multiple-input and multiple-output (MIMO) scheme and/or using a carrier aggregation (CA) scheme.

Figure 2:
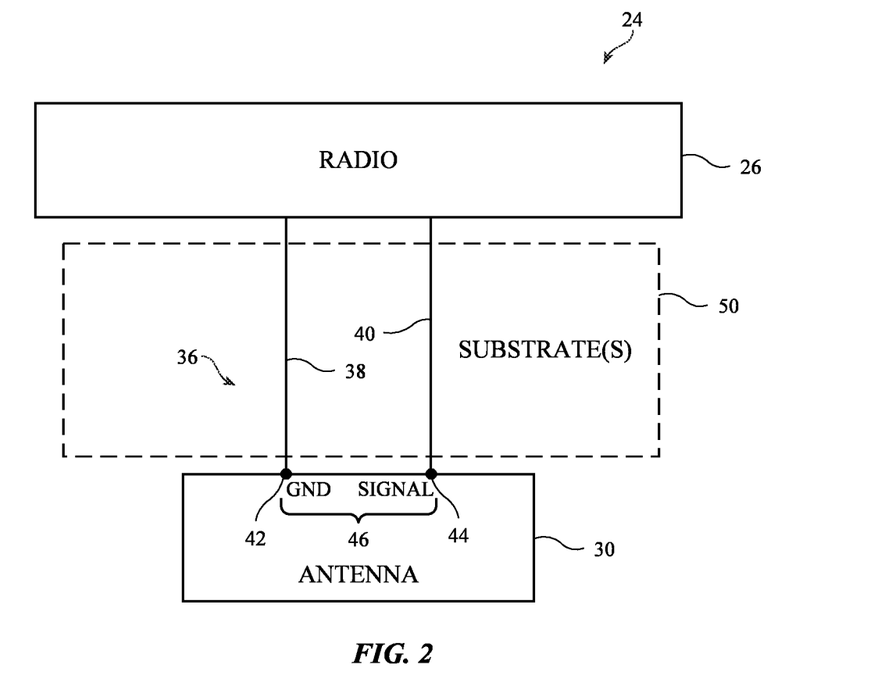
FIG. 2 is a block diagram of illustrative wireless circuitry having transmission line structures in accordance with some embodiments.

FIG. 2 is a functional block diagram of wireless circuitry 24 of FIG. 1. As shown in FIG. 2, each radio 26 may be (communicably) coupled to one or more antennas 30 over one or more radio-frequency transmission lines 36. As an illustrative example, each radio-frequency transmission line 36 may include a ground (GND) conductor such as ground (GND) conductor 38 and a signal conductor such as signal conductor 40. A corresponding antenna 30 may include an antenna feed such as antenna feed 46 having ground (GND) antenna feed terminal 42 coupled to ground (GND) conductor 38 and positive antenna feed terminal 44 coupled to signal conductor 40.

One or more radio-frequency transmission lines 36 may be shared between radios 26 and/or antennas 30 if desired. Radio-frequency front end (RFFE) modules may be interposed on one or more radio-frequency transmission lines 36. The radio-frequency front end modules may include substrates, integrated circuits, chips, or packages that are separate from radios 26 and may include filter circuitry, switching circuitry, amplifier circuitry, impedance matching circuitry, radio-frequency coupler circuitry, and/or any other desired radio-frequency circuitry for operating on the radio-frequency signals conveyed over radio-frequency transmission lines 36.

Radio-frequency transmission lines are often implemented using co-axial cables. However, with a large number of radios and antennas (covering an ever-increasing number of RATs and frequency bands), wireless systems having radio-frequency transmission lines implemented in this manner must employ a large number of co-axial cables and corresponding connector structures, which can be large and bulky. Such a configuration is especially undesirable for small form-factor devices, which have limited interior space. In these devices, it may be impractical to include even a single co-axial cable connector structure, let alone a multitude of co-axial cable connector structures. While other transmission lines structures may be used instead, the use of these other transmission line structures similarly faces space constraints in these small form-factor devices and can lead to degradation in wireless performance if employed in a compact wireless system. It may therefore be desirable to provide radio-frequency transmission lines in a compact manner (e.g., for small form-factor devices or other devices) while providing satisfactory wireless performance in a wireless system.

To provide compact radio-frequency transmission line structures, wireless circuitry 24 (FIG. 2) may include one or more radio-frequency transmission lines 36 that are implemented from radio-frequency transmission line structures (e.g., signal traces, ground traces, etc.) spanning across one or more substrates 50 (e.g., one or more printed circuit substrates). Because electronic devices as described with respect to FIG. 1 (e.g., device 10) often include (printed circuit) substrates to which other device components (e.g., storage circuitry 16, processing circuitry 18, radios 26, etc.) are mounted, integration of radio-frequency transmissions line structures into these printed circuit structures requires fewer additional bulky structures (e.g., compared to configurations in which a dedicated co-axial cable connection is used). While radio-frequency transmission line structures (e.g., forming a single radio-frequency transmission line) spanning across a single printed circuit (substrate) can be used, the single printed circuit may require certain dimensions (e.g., a certain minimum thickness or size) and/or other specialized properties to configure the corresponding radio-frequency transmission line to exhibit a desired or satisfactory impedance at a frequency of operation. As an illustrative example, this desired or satisfactory impedance refers to a transmission line impedance matched with (e.g., the same as, within 0.01% of, within 0.1% of, within 1% of, within 2% of, within 5% of, etc.) the corresponding antenna impedance. Relying on such a specialized printed circuit may be undesirably limiting in terms of useable device space, device costs, etc., especially for a small form-factor device.

Wireless circuitry 24 can therefore include one or more radio-frequency transmission lines 36 each formed from structures on multiple substrates 50 in device 10. By forming radio-frequency transmission line 36 using transmission line structures on multiple such structures (e.g., on printed circuits substrates and/or on other substrates), device 10 can forgo the need for a bulky and/or specialized printed circuit (substrate), the inclusion of which can lead to an increased device size and/or increased costs. Configurations in which one or more radio-frequency transmission lines 36 are each formed from structures across multiple substrates 50 (e.g., on printed circuit substrates and/or on other substrates) are described herein as illustrative examples.

One or more substrates 50 onto which transmission line structures are integrated may include one or more substrates for rigid printed circuit boards and/or flexible printed circuits. As an example, a flexible printed circuit can include a flexible printed circuit substrate formed from polyimide, liquid crystal polymer, other flexible polymer materials, or other suitable materials. If desired, the flexible printed circuit may include multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold the shape thereof after folding without being held in place by stiffeners or other structures). As a further example, a rigid printed circuit board may include a (rigid) printed circuit substrate formed from rigid printed circuit board material such as fiberglass-filled epoxy or fiberglass-epoxy laminate, ceramics, other rigid polymer materials, or other suitable materials. If desired, a printed circuit substrate may be formed from one or more of these flexible and/or rigid materials (e.g., at different portions of the substrate).

One or more substrates 50 onto which transmission line structures are integrated may include one or more substrates for any suitable system. As illustrative examples, these substrates may include a package substrate such as a substrate to which one or more components and/or integrated circuit (IC) dies for a packaged system are mounted (e.g., implementing a system-in-package (SiP)), an interposer substrate such as a substrate in which conductive routing structures are formed to route signals between two or more of IC dies, packaged systems, printed circuits, etc. (e.g., implementing an interposer), or any other substrate. Because an illustrative SiP and an illustrative interposer may both include conductive (routing) traces, vias, and other structures, a SiP or an interposer may sometimes be referred to herein as a printed circuit.

Figure 3:
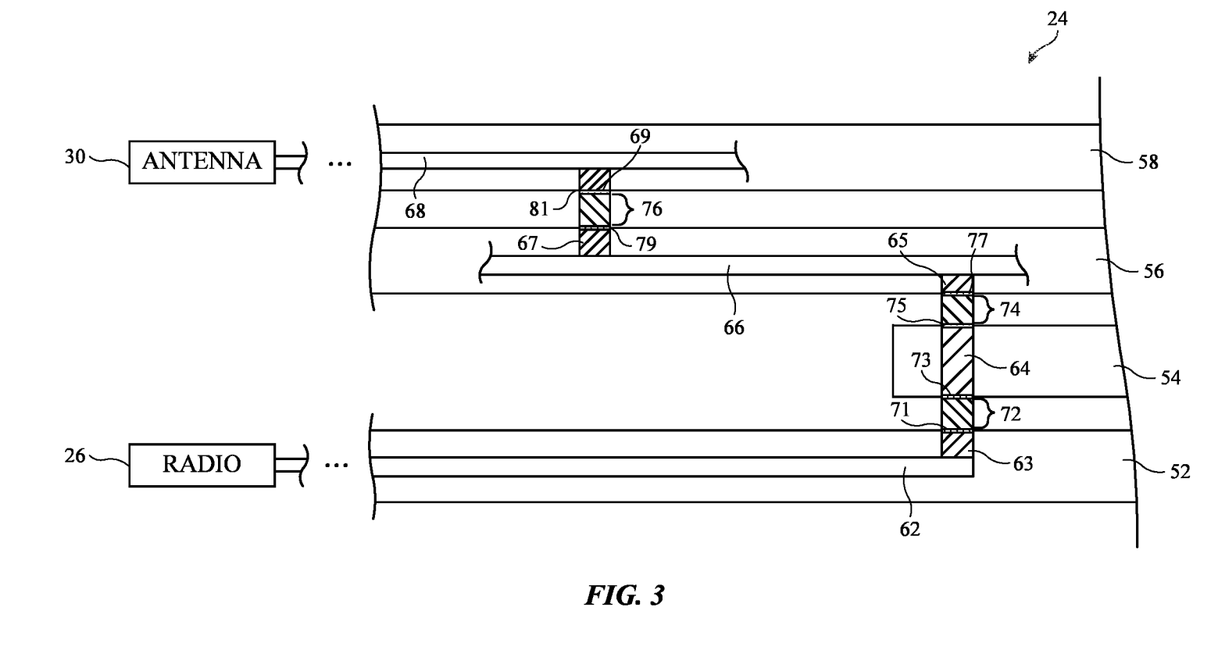
FIG. 3 is a cross-sectional view of illustrative transmission line structures formed across multiple stacked substrates in accordance with some embodiments.

FIG. 3 is a cross-sectional view of wireless circuitry 24 having illustrative transmission line structures integrated onto multiple substrates (e.g., formed from structures across multiple substrates). In the example of FIG. 3, four illustrative substrates 52, 54, 56, and 58 are shown. Each of substrates 52, 54, 56, and 58 may be a substrate of any suitable type as described above (e.g., a rigid printed circuit board substrate, a flexible printed circuit substrate, a hybrid rigid-flexible printed circuit substrate, an interposer substrate, a package or SiP substrate, etc.). Substrate 52 is coupled to (e.g., mounted to or stacked on) substrate 56 through intervening or interposing substrate 54. Substrate 56 is coupled to (e.g., mounted to or stacked on) substrate 58. Conductive structures such as conductive traces, conductive vias, metal traces, metal layers, metal vias, interconnect layers, routing layers, etc., may be disposed on (e.g., embedded within, disposed on one or more external surfaces of, or disposed in other manners on one or more portions of) each of substrates 52, 54, 56, and 58 to form conductive paths that convey signals within each substrate and between different substrates.

Transmission line structures (e.g., one or more signal traces, one or more ground traces, etc.) communicably coupling radio 26 to antenna 30 may be formed from these conductive traces, conductive vias, or other conductive structures on each of substrates 52, 54, 56, and 58. In the example of FIG. 3, radio 26 is coupled (e.g., with or without other intervening interconnect structures) to conductive traces on substrate 52 such as conductive trace 62. Conductive trace 62 forms a first portion of a radio-frequency transmission line (e.g., radio-frequency transmission line 36 in FIG. 2). One or more conductive vias on substrate 52 such as conductive via 63 electrically connects conductive trace 62 to corresponding external contacts on substrate 52 such as contact pad 71 (e.g., implemented as a bond pad, a solder pad, etc.). Contact pad 71 electrically connects to conductive structures on substrates 56 and 58 (forming another portion of transmission line structures) via conductive structures on interposing substrate 54 (forming yet another portion of transmission line structures). If desired, substrate 54 may be omitted (e.g., contact pads on substrates 52 and 56 may be directedly connected to each other using conductive interconnect material such as solder, conductive bumps, conductive adhesive, etc., without intervening conductive structures on a separate interposing substrate).

In the illustrative configuration that includes substrate 54 (as shown in FIG. 3), conductive structures on substrate 54 such as conductive routing structure 64 (e.g., implemented based on one or more conductive vertical vias, one or more conductive horizontal routing layers, and/or other conductive structures) routes an external connection on a first side of substrate 54 to another external connection on a second side of substrate 54 opposing the first side. Contact pad 71 on substrate 52 is connected to a corresponding contact pad 73 on the first side (e.g., a first surface) of substrate 54 via a conductive interconnect structure 72 such as solder, a conductive bump or pillar, conductive adhesive, etc. Contact pad 77 on substrate 56 is connected to a corresponding contact pad 75 on the second side (e.g., a second surface) of substrate 54 via a conductive interconnect structure 74 such as solder, a conductive bump or pillar, conductive adhesive, etc.

In the illustrative configuration shown in FIG. 3, conductive traces on substrate 56 such as conductive trace 66 form a second portion of the radio-frequency transmission line (e.g., radio-frequency transmission line 36 in FIG. 2). One or more conductive vias on substrate 56 such as conductive vias 65 and 67 electrically connect conductive trace 66 to corresponding external contacts on substrate 56 such as contact pad 77 for via 65 and contact pad 79 for via 67 on opposing sides of substrate 56.

In the illustrative configuration shown in FIG. 3, contact pad 79 electrically connects to conductive structures on substrate 58 using a conductive interconnect structure 76 such as solder, a conductive bump or pillar, conductive adhesive, etc. One or more conductive vias on substrate 58 such as conductive via 69 electrically connects conductive traces on substrate 58 such as conductive trace 68 to corresponding external contacts on substrate 58 such as contact pad 81. Conductive trace 68 on substrate 58 form a third portion of the radio-frequency transmission line (e.g., radio-frequency transmission line 36 in FIG. 2). Conductive trace 68 at least partly forming the radio-frequency transmission line portion on substrate 58 is coupled (e.g., with or without other intervening interconnect structures) to antenna 30.

The configuration in which a radio-frequency transmission line is formed as illustrated from FIG. 3 is merely illustrative. If desired, one or more substrates may be omitted in or added to the set of stacked substrates in FIG. 3. As examples, antenna 30 may be electrically connected to conductive trace 66 on substrate 56 without intervening conductive structures on substrate 58, radio 26 may be electrically connected to conductive trace 66 on substrate 56 without intervening conductive structures on interposer 54 and on substrate 52, etc.

While a limited number of conductive traces and vias are shown in connection with each substrate (e.g., substrates 52, 54, 56, and 58) in FIG. 3, any suitable number of conductive traces and vias may be implemented on each substrate to form the appropriate transmission line structures for a radio-frequency transmission line and any additional radio-frequency transmission lines formed across multiple substrates in a similar manner, if desired. As an example, one or more conductive traces and vias in each substrate may be associated with a signal path or conductor (e.g., signal conductor

40 in FIG. 2), one or more conductive traces and vias in each substrate may be associated a ground path or conductor (e.g., ground conductors 38 in FIG. 2), etc. Additional signal and ground conductors (e.g., for the same radio-frequency transmission line or additional radio-frequency transmission lines) may be formed in a similar manner if desired.

In such a manner, one or more radio-frequency transmission lines can each be formed from conductive structures on each of the substrates (e.g., conductive layers, conductive vias, contact pads, etc.), from conductive structures between or external to corresponding substrates (e.g., conductive interconnection structures such as solder, bumps, etc.), from non-conductive structures on each of the substrates (e.g., substrate layers and dielectric layers that provide the appropriate isolation and/or separation between corresponding conductive structures), from non-conductive structures between or external to corresponding substrates (e.g., spacer structures or other structures that provide the appropriate isolation and/or separation between corresponding substrates). Each of these structures may be described herein to form a portion of a radio-frequency transmission line, with the conductive structures forming the signal or ground conductors.

Because transmission line structures for a radio-frequency transmission line are integrated onto substrates that serve other functions in device 10 (e.g., printed circuit substrates that already serve other functions in the device such as a main printed circuit board substrate that provides structural support and signal routing for one or more components in the device, a printed circuit substrate on which storage and processing circuitry and/or other circuitry is mounted, a printed circuit substrate on which an antenna is disposed, a substrate that providing routing between components on one printed circuit and components on another printed circuit, a substrate that serves other suitable functions, a substrate that serves a combination of these functions, etc.), compact transmission line structures having an impedance matched to the corresponding antenna impedance can be implemented in the device without requiring a large footprint in the device (e.g., compared to a co-axial cable connector used to support a co-axial cable).

Configurations in which a transmission line impedance matches that of the coupled antenna are described herein an illustrative example. If desired, other characteristics of the transmission line can also be tuned to effectively convey signals between the radio and the antenna. If desired, to match the transmission line impedance to the antenna impedance, the transmission line impedance need not be exactly the same as the antenna impedance as there may be some mismatch tolerance. If desired, this mismatch could be resolved using additional impedance matching components or structures. Configurations in which the radio-frequency transmission line is coupled to the antenna without these additional intervening impedance matching components or structures are described herein as an illustrative example.

As an example described in connection with FIG. 3, substrate 52 may be a package substrate for a system-in-package (SiP), substrate 56 may be a flexible printed circuit substrate for a main system printed circuit which provides structural support and signal routing to and from different functional components or subsystems in device 10, and substrate 58 may be a flexible printed circuit substrate for a flexible printed circuit that provides routing to one or more antennas. With one illustrative antenna configuration, the one or more antennas coupled to the flexible printed circuit associated with substrate 58 may be disposed on an antenna carrier (e.g., a laser direct structuring (LDS) plastic on which the one or more antennas are patterned) mounted to substrate 58. One or more antennas implemented in other manners may also be used, if desired. In the above illustrative example, substrate 54 may be an interposer substrate for an interposer that interfaces between the SiP and the main system printed circuit (e.g., provides signal routing between one or more components on the SiP and one or more components on the main system printed circuit.

Figure 4:
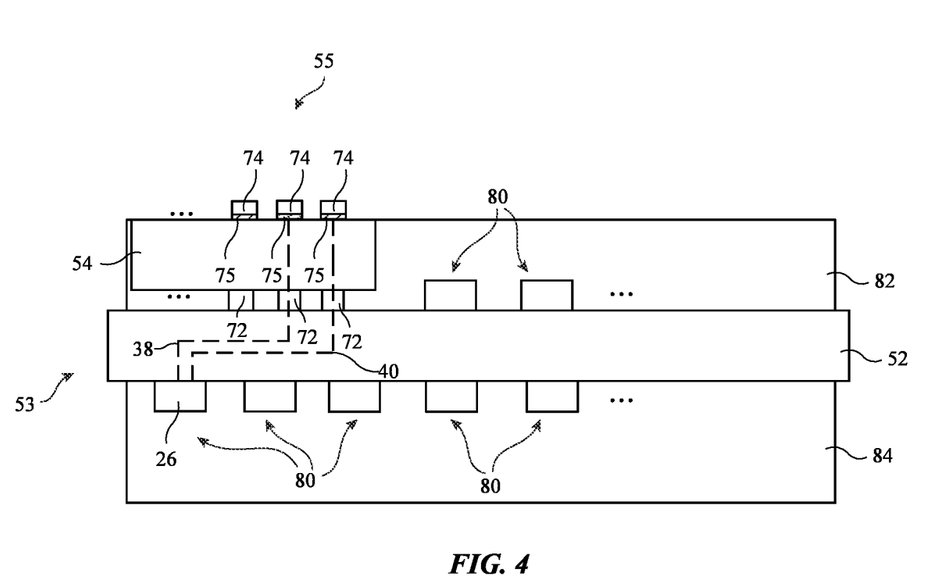
FIG. 4 is a cross-sectional view of an illustrative system-in-package having wireless circuitry and transmission line structures in accordance with some embodiments.

FIG. 4 is a cross-sectional view of an illustrative interposer 55 (e.g., associated with substrate 54 of FIG. 3) mounted to an illustrative SiP 53 (e.g., associated with substrate 52 of FIG. 3). As shown in FIG. 4, SiP 53 includes a package substrate 52 (sometimes referred to as "carrier substrate 52") to which components 80 are mounted (e.g., on both sides of package substrate 52 using solder, wire bonds, conductive bumps, or other conductive interconnect structures). As examples, components 80 may include one or more integrated circuit dies (e.g., each die implementing one or more of storage circuitry 16 in FIG. 1, processing circuitry 18 in FIG. 1, radio(s) 26 in FIG. 1, signal processing circuitry and driver circuitry for one or more input-output devices, power management circuitry, clock management circuitry, etc.), other active components (e.g., input-output devices 22 in FIG. 1, programmable devices, diodes, other semiconductor devices, etc.), passive components (e.g., resistors, capacitors, inductors, etc.), electromechanical components, and any other suitable discrete devices.

In the example of FIG. 4, a particular component 80 implements radio 26 covering one or more RATs (e.g., an integrated circuit die that includes one or more radios). A radio-frequency transmission line such as radio-frequency transmission line 36 in FIG. 2, and if desired, one or more additional radio-frequency transmission lines, may couple radio 26 mounted to substrate 52 to one or more antennas. As analogously described in connection with FIG. 3, conductive structures on package substrate 52, conductive structures on substrate 54, and conductive structures between substrates 52 and 54 (e.g., conductive interconnection structures 72) form radio-frequency transmission line 36 in FIG. 2 coupled to radio 26. In particular, signal conductor 40 in FIG. 2 may be implemented using a first set of conductive structures across substrates 52 and 54, and substrates 56 and 58 in FIG. 3, while ground conductor 38 in FIG. 2 may be implemented using a second set of conductive structures across substrates 52 and 54, and substrates 56 and 58 in FIG. 3. If desired, one or more additional signal conductors may share some of the conductive structures in the first set and one or more additional ground conductors may share some of the conductive structures in the second set.

Because one or more radio-frequency transmission lines 36 in FIG. 2 are implement using structures associated with SiP 53 and interposer 55 such as flexible printed circuits such as those implemented by substrates 56 and 58 in FIG. 3 instead of a co-axial cable, one or more co-axial cable connectors can be omitted. The omission of the bulky co-axial cable connectors not only provides interior space savings, but also allows the SiP to be fully encapsulated (e.g., compared to scenarios in which exposed co-axial cable connectors are needed to provide the co-axial cable connection, leading to one side of the SiP unable to be encapsulated thereby causing components on that side to be susceptible to unwanted weathering).

As shown in FIG. 4, components 80 on both sides of substrate 52 and connections between SiP 53 and interposer 54 are covered by encapsulation 82 and 84. If desired, electromagnetic shielding layers may be deposited on encapsulation 82 and 84 that shield components on SiP 53 from undesired electromagnetic interference. Encapsulation 82 and 84 may be formed from any suitable number and type of encapsulant material such as plastics or specifically thermoplastics, ceramic, etc. Similarly, any suitable process (e.g., spin-on, molding, underfill, etc.) may be used to form encapsulation 82 and 84, and the shielding layers.

When SiP 53 is fully encapsulated and shielded to protect against undesired weathering, temperature, and electromagnetic effects, interposer 55 can serve as the exclusive electrical interface through which components on SiP 53 are accessed. In particular, connection to components on SiP 53 may be made through external contacts on one side of substrate 54 (e.g., contact pads 75). As an example, one or more additional printed circuits (e.g., a flexible printed circuit associated with substrate 56 of FIG. 3) having corresponding contact pads can electrically connect to contact pads 75 via conductive interconnect structures 74.

The configuration of substrates as described above in connection with FIGS. 3 and 4 are merely illustrative. If desired, each of substrates 52, 54, 56, and 58 may serves other functions (e.g., other than supporting the integration of transmission line structures) and may have corresponding structures disposed thereon to serves those functions. As illustrative examples, substrate 52 in FIG. 4 may include additional structures (e.g., conductive routing, or interconnect layers, vias, etc.) for performing signal routing for other components 80 (e.g., other than radio 26), and similarly, substrate 54 in FIG. 4 may include additional structures (e.g., conductive routing or interconnect layers, vias, etc.) for forming the appropriate signal routing paths from external contacts from one side of interposer 55 to external contacts on the other side of interposer 55 for other components 80. Substrates 56 and 58 may similarly have corresponding additional structures thereon serving any suitable routing functions.

Figure 5:
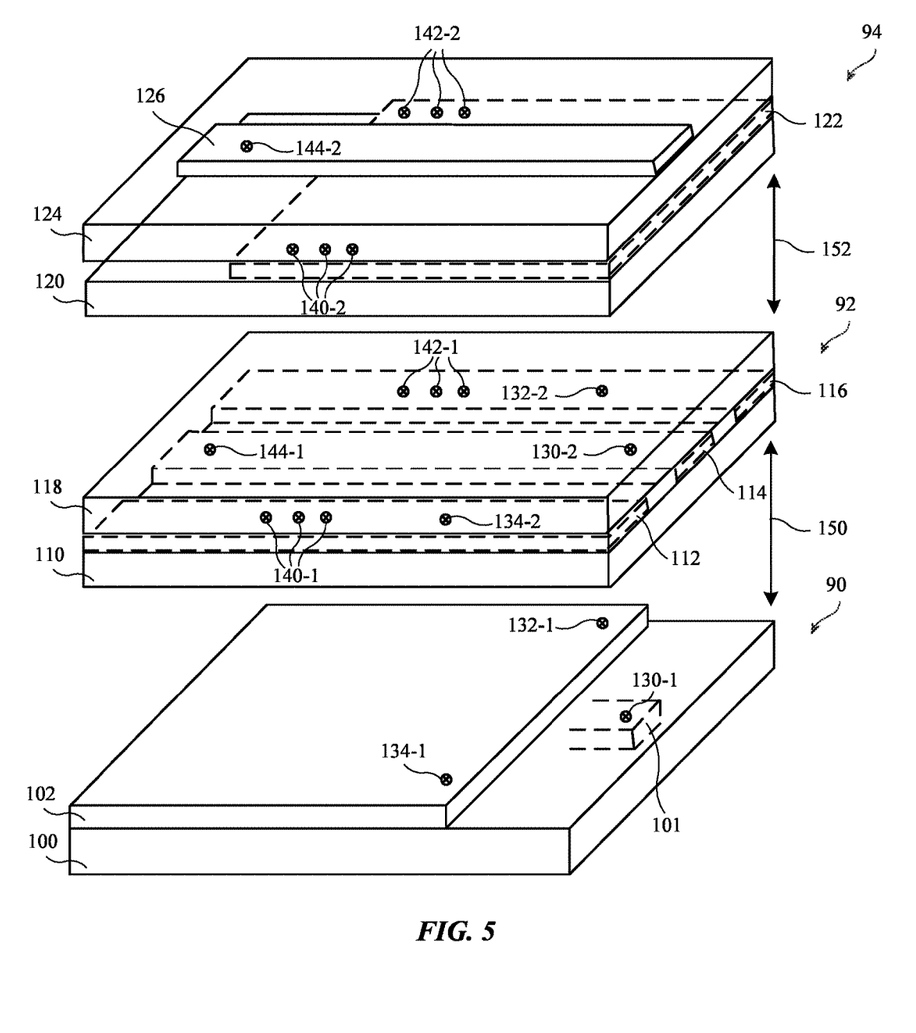
FIG. 5 is an exploded perspective view of illustrative substrate layers and conductive structures forming transmission line structures for a radio-frequency transmission line in accordance with some embodiments.

FIG. 5 is an exploded perspective view of illustrative transmission line structures for a radio-frequency transmission line that are distributed or integrated across multiple substrates. In the example of FIG. 5, transmission line structures for a radio-frequency transmission line are formed from three illustrative sets of stacked metal and substrate layers.

As shown in FIG. 5, the first set of metal and substrate layers 90 includes a substrate layer 100 and metal layers 101 and 102 on substrate layer 100 (e.g., where metal layer 102 is on a top surface of substrate 100 and metal layer 101 is embedded within substrate 100 or on a bottom surface of substrate 100). The second set of metal and substrate layers 92 includes substrate layers 110 and 118 (sometimes referred to herein, collectively, as "a substrate," which can have multiple substrate layers laminated or adhered together) and a metal layer having metal traces 112, 114, and 116 between substrate layers 110 and 118 (e.g., metal traces 112, 114, and 116 embedded within a multilayer substrate). Metal trace 112 may be laterally separated and electrically isolated from metal trace 114 by a gap filled with non-conductive material (e.g., a portion of the multilayer substrate or a substrate layer, a dielectric layer, an adhesive, an insulator, etc.). Similarly, metal traces 116 may be laterally separated and electrically isolated from metal trace 114 by a gap filled with non-conductive material.

The third set of metal and substrate layers 94 includes substrate layers 120 and 124 (sometimes referred to herein, collectively, as "a substrate," which can have multiple substrate layers laminated or adhered together), metal layer 122 between substrate layers 120 and 124 (e.g., embedded within a multilayer substrate), and metal layer 126 on substrate layer 124 (e.g., on a top surface of the multilayer substrate). If desired, non-conductive material (e.g., a portion of the multilayer substrate or a substrate layer, a dielectric layer, an adhesive, etc.) may also fill the gap between substrate layers 120 and 124 and in the same lateral plane as metal layer 122. If desired, one or more substrate layers (e.g., substrates) may sometimes be referred to herein as "insulators" or "insulator layers" (e.g., that separate and provide insulation between ground traces and signal traces, between different ground traces, between different signal traces, etc.).

By tuning the relative configuration (e.g., distance, thickness, geometry, material) between the different sets of metal and substrate layers, the overall radio-frequency transmission line may inherently serve as an impedance matching structure that allows for signal conveyance to and from the antenna without mismatch loss (e.g., the radio-frequency transmission line inherently does not suffer from mismatch loss when conveying signals to and from the antenna). In other words, any separate intervening impedance matching structures (e.g., discrete components such as capacitor, inductors, etc., external to the radio-frequency transmission line structures) can be omitted as additional impedance matching is not required.

In one illustrative configuration, the set of layers 94 forms a portion of a first flexible printed circuit (e.g., a flexible printed circuit having a multilayer laminated structure or substrate, a flexible printed circuit associated with substrate 58 in FIG. 3, etc.). The set of layers 92 forms an overlapping portion of a second flexible printed circuit (e.g., a flexible printed circuit having a multilayer laminated structure or substrate, a flexible printed circuit associated with substrate 56 in FIG. 3, etc.), and the set of layers 90 forms an overlapping portion of a SiP or a SiP substrate (e.g., a SiP associated with substrate 52 in FIG. 3, a package substrate 52 for SiP 53 in FIG. 4, etc.). Portions of the SiP or the SiP substrate are omitted from the set of layers 90 shown in FIG. 5 for the sake of clarity.

Conductive structures (e.g., metal layers, metal traces, etc.) on each set of layers 90, 92, and 94 are connected to each other to collectively form transmission line structures for a radio-frequency transmission line.

In general, it may be desirable for a radio-frequency transmission line to exhibit a particular satisfactory characteristic impedance (e.g., a 50-Ohm impedance transmission line) to minimize antenna signal losses (e.g., signal reflection) between the antenna and the radio-frequency transmission line. The characteristic impedance of the transmission line may be satisfactory at least in part because the transmission line is matched to (e.g., is the same as, is within 0.01% of, is within 0.1% of, is within 1% of, is within 2% of, is within 5% of, etc.) the corresponding impedance of the antenna to which the transmission line is coupled such that mismatch loss is minimized. However, in devices with printed circuits having relatively small dimensions (e.g., thickness), it may be difficult to provide a radio-frequency transmission line that exhibits the particular impedance because of the size (e.g., thickness) constraints of a small printed circuit.

To mitigate the issues described above and provide a radio-frequency transmission line with an impedance matched to the antenna impedance, conductive structures from multiple printed circuits and other structures may be selectively configured and connected to tune the composite or collective characteristic impedance of the radio-frequency transmission line. In other words, the relative configuration of layers within the sets 90, 92, and 94 (and other neighboring or adjacent structures) may, collectively, contribute to the composite or collective impedance of the overall radio-frequency transmission line.

As an illustrative example, the individual characteristic impedance of a first radio-frequency transmission line portion implemented on set of layers 90, the individual characteristic impedance of a second radio-frequency transmission line portion implemented on set of layers 92, the individual characteristic impedance of a third radio-frequency transmission line portion implemented on set of layers 94, may, taken individually (e.g., taken each in isolation), exhibit respective individual impedances that are more capacitive (e.g., less than a target 50-Ohm impedance line) or more inductive (e.g., greater than a target 50-Ohm impedance line) than the target characteristic impedance of the radio-frequency transmission line (e.g., a 50-Ohm impedance transmission line). However, taken collectively, the three radio-frequency transmission line portions along with any corresponding interconnect and neighboring structures will form a radio-frequency transmission line with the target characteristic impedance (e.g., a 50-Ohm impedance transmission line). In a similar manner, the transmission line structures across multiple substrates as described in connection with FIGS. 3 and 4 may also collectively exhibit a target overall characteristic impedance (sometimes referred to herein as a "collective" or "composite" impedance) even though the transmission line structures individually do not exhibit the target impedance.

The radio-frequency transmission line configured in this manner can convey radio-frequency signals to and from the antenna without mismatch loss. Accordingly, discrete components such as inductors and capacitors useable for impedance matching (e.g., impedance matching structures external to the printed circuit structures forming the radio-frequency transmission line) can therefore be omitted as the radio-frequency transmission line itself serves inherently as an impedance matching structure. In other words, the impedance offsets of the different portion of the radio-frequency transmission line from the target impedance are not matched using the discrete components. Rather, the different portions of the radio-frequency transmission line on the different printed circuits are configured or tuned relative to each other (e.g., by adjust layer thickness, distance between layers, layer geometry, layer material, etc.) to directly achieve signal conveyance without mismatch loss.

Configurations in which a radio-frequency transmission line exhibits an impedance of 50 Ohms are described herein as an illustrative example. The impedance of the radio-frequency transmission line is frequency-dependent (e.g., dependent on the one or more frequencies of radio-frequency signals conveyed by the radio-frequency transmission line between the antenna and the radio). If desired, at the one or more frequencies of operation (e.g., at one or more frequency bands), the radio-frequency transmission line may be configured to exhibit any suitable target input, output, and/or characteristic impedance such as an impedance of 50 Ohms, an impedance between 45-55 Ohms, an impedance between 40-60 Ohms, etc. Accordingly, at the one or more frequencies of operation, each of the separate radio-frequency transmission line portions may exhibit an individual impedance that is more capacitive (e.g., less than) or more inductive (e.g., greater than) than the impedance of the overall radio-frequency transmission line. As examples, the individual impedances along each radio-frequency transmission line portion (e.g., implemented on a single printed circuit), may exhibit an input, output, and/or characteristic impedance within 1%, within 2%, within 5%, within 10%, within 20%, etc. of the impedance of the overall radio-frequency transmission line at the one or more frequencies of operation.

To help tune the impedance of the overall radio-frequency transmission line, different metal layers may be selectively interconnected with each other at corresponding contact locations (e.g., using vias and routing layers within substrate layers, using contact or solder pads at the surface of the substrate layers, using solder blocks, other solder structures, or other conductive interconnect structures between substrate layers of different or the same set of layers each set associated with a printed circuit, package, interposer, etc.). Additionally, distances or separation between the different printed circuits, packages, interposers, etc. (e.g., between sets 90, 92, and 94 such as distance 150 between set 90 and set 92 and distance 152 between set 92 and set 94) may also be controlled to more predictably tune the impedance of the overall radio-frequency transmission line. Configurations relative to (e.g., distances to or separation with) neighboring structures may also be controlled to more predictably tune the impedance of the overall radio-frequency transmission line.

As an illustrative example, an individual (characteristic) impedance of a transmission line portion on a single printed circuit (e.g., at one of sets 90, 92, or 94) may be defined by the separation of signal and ground conductors by insulator structures within that single printed circuit as well as by the dimension and geometry of the signal and ground conductors, the properties of the insulator structures, and other characteristics of that single printed circuit. In some configurations, the characteristics of single printed circuit may be too restrictive in providing the desired impedance of the overall transmission line (e.g., solely based on the transmission line portion on the single printed circuit). However, by utilizing separations relative to and structures on other neighboring elements (e.g., other overlapping printed circuits, conductor and insulator structures on the printed circuits, spacers, or any other adjacent components), the characteristics of the transmission line portion on the single printed circuit may be adjusted or supplemented by these neighboring elements to collectively achieve the desired impedance of the overall transmission line.

Still referring to FIG. 5, one or more interconnect structures (e.g., vias and routing layers within substrate layers, contact or solder pads at the surface of the substrate layers, solder blocks, other solder structures, or other conductive interconnect structures between substrate layers of different or the same set of layers each set associated with a printed circuit, package, interposer, etc.) may connect metal layer or trace 101 to metal trace 114 across illustrative contact location 130-1 and 130-2. One or more interconnect structures may connect metal trace 114 to metal layer or trace 126 across illustrative contact locations 144-1 and 144-2. Metal traces 101, 114, and 126, as interconnected, may form a signal conductor (e.g., signal conductor 40 in FIG. 2) for the radio-frequency transmission line. On one end of the signal conductor, metal trace 101 may be coupled to a radio such as radio 26 in FIG. 2, and on the other end of the signal conductor, metal trace 126 may be coupled to an antenna such as antenna 30 at positive antenna feed terminal 44 in FIG. 2.

One or more interconnect structures may connect metal layer or trace 102 to metal trace 116 across illustrative contact locations 132-1 and 132-2. One or more interconnect structures may connect metal layer or trace 102 to metal trace 112 across illustrative contact locations 134-1 and 134-2. One or more interconnect structures may connect metal trace 112 to metal layer or trace 122 across one or more illustrative contact locations (e.g., across an illustrative set of three locations 140-1 and 140-2). One or more interconnect structures may connect metal trace 116 to metal layer or trace 122 across one or more illustrative contact locations (e.g., across an illustrative set of three locations 142-1 and 142-2). Metal traces 102, 112, 116, and 122, as interconnected, may form one or more ground conductor portions (e.g., ground conductor 38 in FIG. 2) for the radio-frequency transmission line. On one end of the ground conductor metal trace 102 may be coupled to a radio such as radio 26 and other device structures (e.g., a battery, other grounding structures for device components, a device housing, etc.), and on the other of the ground conductor, metal trace 122 may be coupled to an antenna such as antenna 30 at ground antenna feed terminal 42 in FIG. 2.

Figure 6:
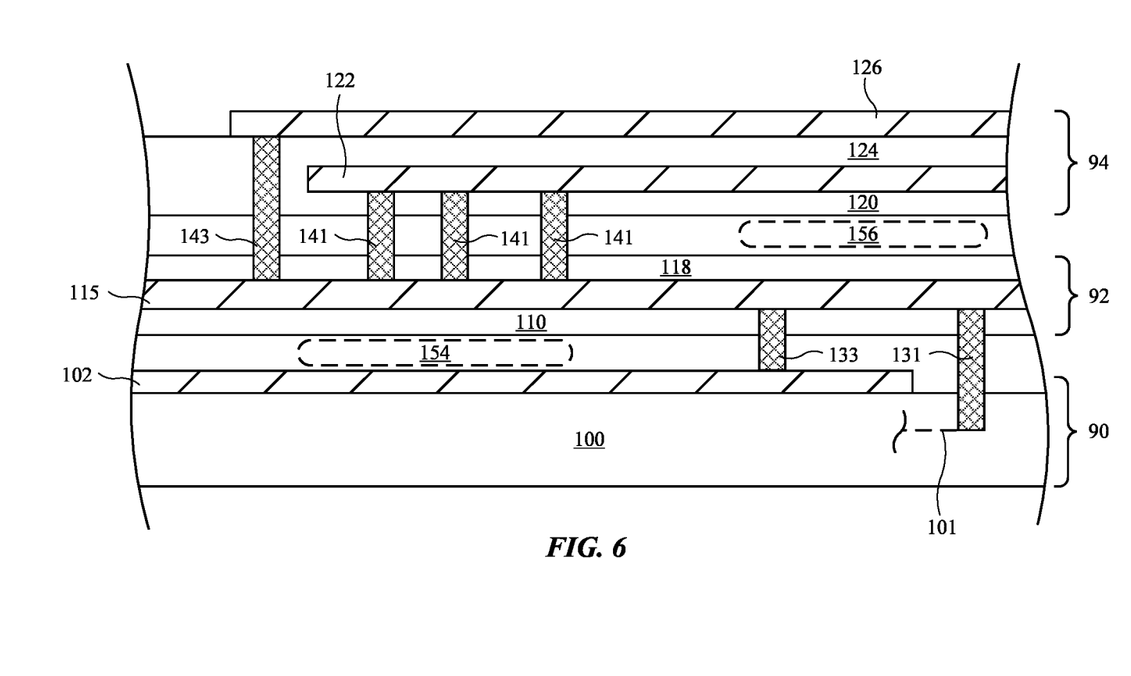
FIG. 6 is an illustrative side view of assembled substrate layers and conductive structures forming transmission line structures in accordance with some embodiments.

FIG. 6 is an illustrative side view of sets of layers 90, 92, and 94 of FIG. 5 when assembled (e.g., interconnected with each other, mounted to each other, etc.). Configurations in which each set of sets 90, 92, and 94 forms a different printed circuit having a separate substrate are described as illustrative examples (e.g., referred to herein sometimes as "printed circuit 90," "printed circuit 92," and "printed circuit 94").

As shown in FIG. 6, interconnect structures 131 electrically connect metal trace 101 to a metal trace in metal layer 115 (e.g., to metal trace 114 in FIG. 5 that may be formed in the same metal layer 115 as metal traces 112 and 116 in FIG. 5). Interconnect structures 133 electrically connect metal trace 102 to a metal trace in metal layer 115 (e.g., to metal trace 112 in FIG. 5 that may be formed in the same metal layer 115 as metal traces 114 and 116 in FIG. 5). Similar additional interconnect structures may also electrically connect metal trace 102 to metal trace 116 in FIG. 5 (in layer 115 in FIG. 6). Interconnect structures 131 and 133 and the additional interconnect structures may include conductive printed circuit routing structures such as vias, interconnect layers, external contact pads etc., on printed circuit 90 and on printed circuit 92, and may include conductive structures between printed circuit 90 and printed circuit 92 such as solder (balls, bumps, blocks, etc.) or other conductive material that connects corresponding contact pads on printed circuits 90 and 92.

Interconnect structures 141 electrically connect a metal trace in metal layer 115 (e.g., metal trace 112 in FIG. 5) to metal trace 122. Similar additional interconnect structures may also electrically connect metal trace 116 in FIG. 5 or in layer 115 in FIG. 6 to metal trace 122. Interconnect structures 143 electrically connect a metal trace in metal layer 115 (e.g., metal trace 114 in FIG. 5) to metal trace 126. Interconnect structures 141 and 143 and the additional interconnect structures may include conductive printed circuit routing structures such as vias, interconnect layers, external contact pads etc., on printed circuit 92 and on printed circuit 94, and may include conductive structures between printed circuit 92 and printed circuit 94 such as solder (balls, bumps, blocks, etc.) or other conductive material that connects corresponding contact pads on printed circuits 92 and 94.

The dimensions (e.g., height and pitch) of interconnect structures 131 and 133 (e.g., solder blocks between printed circuits 90 and 92) may be controlled to preserve a desired distance (e.g., distance 150 in FIG. 5) between printed circuits 90 and 92 (e.g., between metal traces in printed circuits 90 and 92) and to account for capacitive loading between different elements forming interconnect structures 131 and 133 (e.g., capacitive loading associated with sizes of solder pads at corresponding interfaces of printed circuits 90 and 92) in controlling the overall impedance of the radio-frequency transmission line. Similarly, the dimensions (e.g., height and pitch) of interconnect structures 141 and 143 may also be controlled to preserve a desired distance (e.g., distance 152 in FIG. 5) between printed circuits 92 and 94 (e.g., between metal traces in printed circuits 92 and 94) and to account for capacitive loading between different elements forming interconnect structures 141 and 143 (e.g., capacitive loading associated with sizes of solder pads at corresponding interfaces of printed circuits 92 and 94) in controlling the overall impedance of the radio-frequency transmission line.

If desired, other components or structures such as components or structures 154 and 156 may be disposed between printed circuits 90, 92, and 94 for controlling and/or maintaining distances between printed circuits 90, 92, and 94. As examples, components or structures 154 and 156 may be dedicated spacer structures, may be components disposed on one or more of printed circuits 90, 92, and 94, may be components separate from printed circuits 90, 92, and 94, etc.

In illustrative configurations where one or more printed circuits 90, 92, and 94 individually have dimensions (e.g., a corresponding thickness) unsuitable to provide a radio-frequency transmission line with a target impedance, the configuration of printed circuits 90, 92, and 94 in FIG. 6 provides a manner to implement a radio-frequency transmission line across printed circuits 90, 92, and 94 to collectively exhibit a composite impedance for the radio-frequency transmission line that is matched to the corresponding antenna impedance. Additionally, a patterned grounding scheme connecting different reference ground layers in printed circuits 90, 92, and 94 (e.g., using conductive structures 133 and 141) as shown in FIG. 6 helps to provide grounding connections allowing for free-flowing current across different ground portions, thereby forming a ground conductor in the radio-frequency transmission line. If desired, conductive structures 133 and 141 (e.g., implemented at least in part by ground pads and solder blocks) may be located across any suitable overlapping portions of metal trace 102 (FIGS. 5 and 6), metal trace 112 (FIG. 5) in layer 115 (FIG. 6), metal trace 116 (FIG. 5) in layer 115 (FIG. 6), and metal trace 122 (FIGS. 5 and 6) at any suitable location to ensure proper grounding across all of these metal (ground) traces in different printed circuits, thereby allowing return current to move freely along different portions of the ground conductor in different printed circuits.

The configuration of transmission line structures integrated across printed circuits 90, 92, and 94 as described in connection with FIGS. 5 and 6 are merely illustrative. The description in connection with FIGS. 5 and 6 may similarly apply to the transmission line structures described in connection with FIGS. 2-4 (e.g., transmission line structures across printed circuits 52, 54, 56, and 58 in FIG. 3 may collectively form a radio-frequency transmission line with an impedance matched to the antenna impedance by controlling the various characteristics described in connection with printed circuits 90, 92, and 94 in FIGS. 5 and 6).

Figure 7:
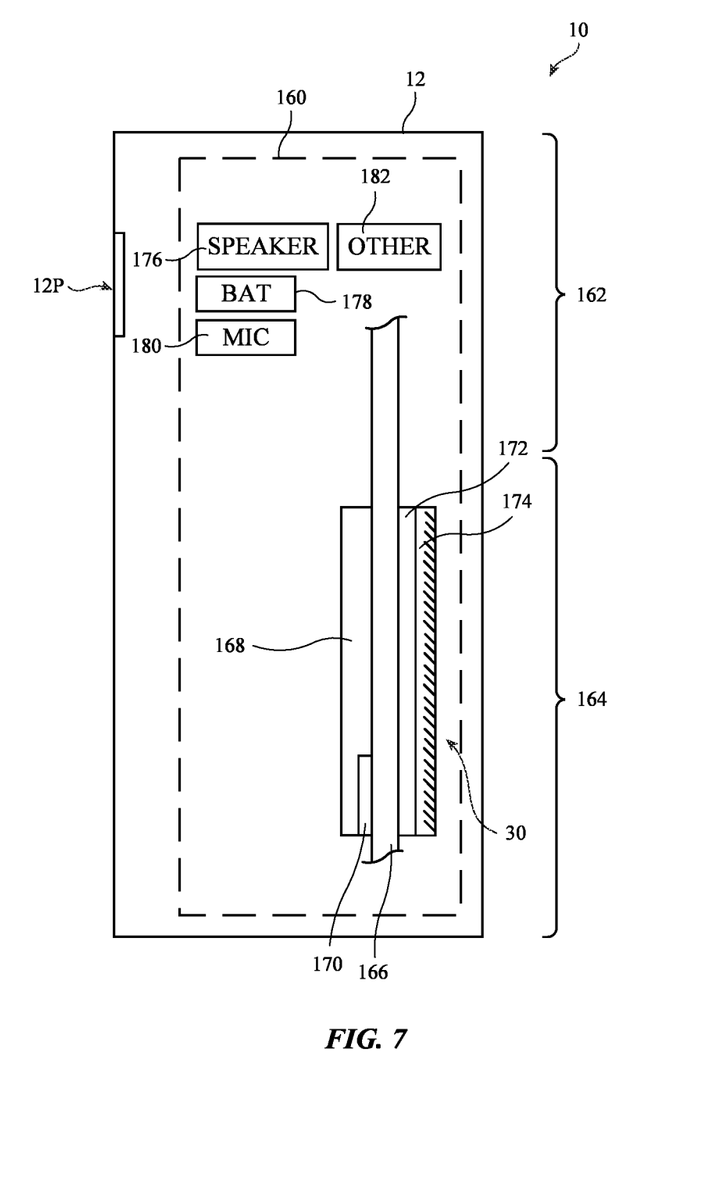
FIG. 7 is a diagram of an illustrative electronic device implementing transmission line structures for wireless circuitry using multiple stacked substrates in accordance with some embodiments.

An illustrative electronic device 10, such as a wristwatch device, a speaker device, an earbud, an earpiece device, or any other device described in connection with FIG. 1, having wireless circuitry employing one or more radio-frequency transmission lines each integrated across multiple printed circuits as described in connection with FIGS. 2-6 is shown in FIG. 7.

In the example of FIG. 7, housing 12 of device 10 includes first portion 162 and second portion 164. Housing 12 may include one or more ports such as ports 12P that are aligned with one or more internal components such as speaker 176 (e.g., a speaker port). Housing 12 separates an exterior of device 10 from an interior (e.g., interior 160) of device 10, in which components of device 10 are disposed. The components of device 10 may include battery (BAT) 178, microphone (MIC) 180, any other components 182 such as those described in connection with FIG. 1. One or more of these components (e.g., processing circuitry 18, storage circuitry 16, radio 26, antenna 30, input-output devices 22, etc., in FIG. 1) may be mounted on one or more printed circuits in device 10.

As examples, device 10 may include a printed circuit to which a radio, processing circuitry, storage circuitry, etc. are mounted in a package (e.g., forming SiP 168), a printed circuit serving as a system printed circuit that extends across interior 160 of device 10 (e.g., extending across first and second portions 162 and 164) to provide structural support and connectivity across different sub-systems in device 10 (e.g., forming system flexible printed circuit 166), a printed circuit that serves as a routing interface between components mounted to SiP 168 and system flexible printed circuit 166 (e.g., forming interposer 170), and a printed circuit that provides antenna signal routing to and from one or more antennas such as antenna 30 (e.g., forming antenna flexible printed circuit 172). As an illustrative example, antenna 30 may be patterned (e.g., using an LDS process) on an antenna carrier 174 (e.g., an LDS plastic) mounted on flexible printed circuit 172.

A radio in SiP 168 may be coupled to antenna 30 using a radio-frequency transmission line having transmission line structures that extend across and are integrated with SiP 168, interposer 170, system flexible printed circuit 166, and antenna flexible printed circuit 172 (e.g., using configurations as described in connection with FIGS. 2-6), thereby providing a compact radio-frequency transmission line exhibiting an impedance matched with an impedance of antenna 30 without the need for separate intervening impedance matching elements such as capacitor and/or inductors. Transmission line structures on antenna flexible printed circuit 172 may be coupled to antenna 30 on carrier 174 via one or more suitable conductive interconnect structures (e.g., solder, welds, conductive adhesive, screws, brackets, etc.) to feed antenna 30.

The foregoing is merely illustrative and various modifications can be made to the described embodiments. The foregoing embodiments may be implemented individually or in any combination.

What is claimed is:

1. Radio-frequency transmission line structures comprising:
    a first printed circuit having a first substrate and first conductive traces disposed on the first substrate;
    a second printed circuit having a second substrate and second conductive traces disposed on the second substrate; and
    conductive interconnect structures that couple a signal conductor portion of the first conductive traces at a first location of the first conductive traces to a signal conductor portion of the second conductive traces at a second location of the second conductive traces;
    the signal conductor portion of the first conductive traces extending from the first location toward a radio;
    the signal conductor portion of the second conductive traces extending from the second location toward an antenna; and
    the first conductive traces having a ground conductor portion interposed between the signal conductor portion of the first conductive traces and the signal conductor portion of the second conductive traces.

2. The radio-frequency transmission line structures of claim 1, wherein the first conductive traces and the second conductive traces at least partly form a radio-frequency transmission line having a characteristic impedance based on a separation between the first conductive traces and the second conductive traces.

3. The radio-frequency transmission line structures of claim 1, wherein the second conductive traces have a ground conductor portion on opposing sides of the signal conductor portion of the second conductive traces.

4. The radio-frequency transmission line structures of claim 3, wherein the ground conductor portion of the first conductive traces overlaps the ground conductor portion of the second conductive traces, the signal conductor portion of the first conductive traces, and the signal conductor portion of the second conductive traces.

5. The radio-frequency transmission line structures of claim 1, wherein the ground conductor portion of the first conductive traces overlaps the signal conductor portion of the first conductive traces and the signal conductor portion of the second conductive traces across an overlapping area and wherein the conductive interconnect structures couple the signal conductor portion of the first conductive traces to the signal conductor portion of the second conductive traces outside of the overlapping area.

6. The radio-frequency transmission line structures of claim 1 further comprising:
    a component between the first printed circuit and the second printed circuit that is configured to maintain a distance separating the second printed circuit from the first printed circuit.

7. The radio-frequency transmission line structures of claim 1, wherein the first printed circuit comprises a first flexible printed circuit and the second printed circuit comprises a second flexible printed circuit.

8. A radio-frequency transmission line comprising:
    a signal conductor that includes first signal traces on a first printed circuit and second signal traces on a second printed circuit, the first signal traces on the first printed circuit having a first end coupled to an antenna, having a second end coupled to the second signal traces on the second printed circuit, and having a portion extending between the first end of the first signal traces and the second end of the first signal traces; and
    a ground conductor that includes first ground traces on the first printed circuit and second ground traces on the second printed circuit;
    the portion of the first signal traces on the first printed circuit overlapping a portion of the second signal traces on the second printed circuit; and
    the first ground traces on the first printed circuit being interposed between the portion of the first signal traces on the first printed circuit and the portion of the second signal traces on the second printed circuit.

9. The radio-frequency transmission line of claim 8, wherein the second ground traces on the second printed circuit are disposed on opposing sides of the second signal traces on the second printed circuit and wherein the second ground traces on the second printed circuit overlap the first ground traces on the first printed circuit.

10. The radio-frequency transmission line of claim 8 further comprising:
conductive interconnect structures that couple, at a plurality of locations, the first ground traces on the first printed circuit to the second ground traces on the second printed circuit.

11. The radio-frequency transmission line of claim 10 further comprising:
additional conductive interconnect structures that couple the second end of the first signal traces on the first printed circuit to the second signal traces on the second printed circuit, the conductive interconnect structures and the additional conductive interconnect structures including solder between the first printed circuit and the second printed circuit.

12. The radio-frequency transmission line of claim 10, wherein the conductive interconnect structures: include solder between the first printed circuit and the second printed circuit, include a first contact pad on the first printed circuit, include a second contact pad on the second printed circuit, include a first conductive via on the first printed circuit, and include a second conductive via on the second printed circuit.

13. The radio-frequency transmission line of claim 12, wherein the first conductive via couples the first ground traces to the first contact pad, the second conductive via couples the second ground traces to the second contact pad, and the solder couples the first contact pad to the second contact pad.

14. An electronic device comprising:
a radio;
an antenna;
a first printed circuit substrate;
a second printed circuit substrate that at least partially overlaps the first printed circuit substrate;
a radio-frequency transmission line that communicably couples the radio to the antenna; and
one or more components configured to maintain a separation between the first printed circuit substrate and the second printed circuit substrate;
the radio-frequency transmission line including
a first signal trace on the first printed circuit substrate,
a first ground trace on the first printed circuit substrate,
a second signal trace in a metal layer on the second printed circuit substrate,
a second ground trace in the metal layer on the second printed circuit substrate, and
a third ground trace in the metal layer on the second printed circuit substrate; and
the transmission line having a characteristic impedance based at least in part on the maintained separation, the first signal trace, the second signal trace, the first ground trace, the second ground trace, and the third ground trace.

15. The electronic device of claim 14, wherein the first ground trace on the first printed circuit substrate is disposed between the first signal trace on the first printed circuit substrate and the second signal trace on the second printed circuit substrate.

16. The electronic device of claim 14, further comprising:
conductive interconnect structures that couple the first ground trace on the first printed circuit substrate to the second ground trace on the second printed circuit substrate and to the third ground trace on the second printed circuit substrate at opposite lateral sides of the second signal trace on the second printed circuit substrate.

17. The electronic device of claim 14, wherein the first printed circuit substrate includes a first flexible printed circuit substrate, the first signal trace and the first ground trace are on the first flexible printed circuit substrate, the second printed circuit substrate includes a second flexible printed circuit substrate, and the second signal trace, the second ground trace, and the third ground trace are on the second flexible printed circuit substrate.

18. The electronic device of claim 14, further comprising:
control circuitry coupled to the radio and configured to control an operation of the radio, wherein the first printed circuit substrate is a package substrate for a package, wherein the control circuitry and the radio are mounted to the package substrate, and wherein encapsulation material is disposed on the package substrate and encapsulates the control circuitry and the radio.

\* \* \* \* \*